(12) United States Patent
Holi

(10) Patent No.: US 12,489,440 B2
(45) Date of Patent: Dec. 2, 2025

(54) POWER-ON RESET CIRCUIT

(71) Applicant: NXP B.V., Eindhoven (NL)

(72) Inventor: Sampath Shivappa Holi, Kittur (IN)

(73) Assignee: NXP B.V., Eindhoven (NL)

( * ) Notice: Subject to any disclaimer, the term of this patent is extended or adjusted under 35 U.S.C. 154(b) by 8 days.

(21) Appl. No.: 18/743,265

(22) Filed: Jun. 14, 2024

(65) Prior Publication Data
US 2025/0119135 A1 Apr. 10, 2025

(30) Foreign Application Priority Data
Oct. 6, 2023 (IN) .............................. 202341067186

(51) Int. Cl.
*H03K 17/22* (2006.01)
*G01R 19/165* (2006.01)

(52) U.S. Cl.
CPC ..... *H03K 17/223* (2013.01); *G01R 19/16552* (2013.01)

(58) Field of Classification Search
None
See application file for complete search history.

(56) References Cited

U.S. PATENT DOCUMENTS

| | | | |
|---|---|---|---|
| 5,936,444 A | 8/1999 | Pathak et al. | |
| 7,417,476 B1 * | 8/2008 | Hung | G06F 1/24 327/143 |
| 8,692,593 B1 * | 4/2014 | Zhang | G06F 1/30 327/143 |
| 8,754,679 B2 | 6/2014 | Sanborn et al. | |
| 9,369,124 B2 * | 6/2016 | Gunther | H03K 17/223 |
| 10,312,902 B2 | 6/2019 | Singh et al. | |
| 2014/0035634 A1 | 2/2014 | Shrivastava et al. | |

* cited by examiner

*Primary Examiner* — Jeffrey S Zweizig

(57) ABSTRACT

A power-on reset (POR) circuit includes first and second trip detector circuits. The first trip detector circuit generates a reset signal indicative of a state of a supply voltage based on a trip node voltage that ramps up when the supply voltage ramps up. The reset signal is asserted when the trip node voltage exceeds a threshold value. The second trip detector circuit generates a control signal based on the supply voltage and a reference voltage. The reference voltage is less than the supply voltage until the supply voltage ramps down. During the ramp-down of the supply voltage, the supply voltage falls below the reference voltage, and the control signal is asserted when the supply voltage is less than the reference voltage by a different threshold value. The asserted control signal results in the trip node voltage being altered such that the reset signal is de-asserted.

20 Claims, 3 Drawing Sheets

POWER-ON RESET CIRCUIT

CROSS-REFERENCE TO RELATED APPLICATIONS

This application claims the priority under 35 U.S.C. § 119 of India application No. 202341067186, filed on 6 Oct. 2023, the contents of which are incorporated by reference herein.

FIELD OF USE

The present disclosure relates generally to electronic circuits, and, more particularly, to a power-on reset circuit.

BACKGROUND

Integrated circuits (ICs) include various functional circuits that are critical for operations thereof. Such functional circuits require a supply voltage to be above a predefined value to ensure the accurate execution of associated operations. Such a predefined value of the supply voltage is referred to as a trip value. When an IC is powered up, the supply voltage ramps up at different ramp rates before settling to a particular value. During the ramp-up, if the functional circuits are operated at the supply voltage that is less than the trip value, erroneous output may be generated, which may result in the malfunction of the IC.

BRIEF DESCRIPTION OF THE DRAWINGS

The following detailed description of the embodiments of the present disclosure will be better understood when read in conjunction with the appended drawings. The present disclosure is illustrated by way of example, and not limited by the accompanying figures, in which like references indicate similar elements.

DETAILED DESCRIPTION

Figure 1:
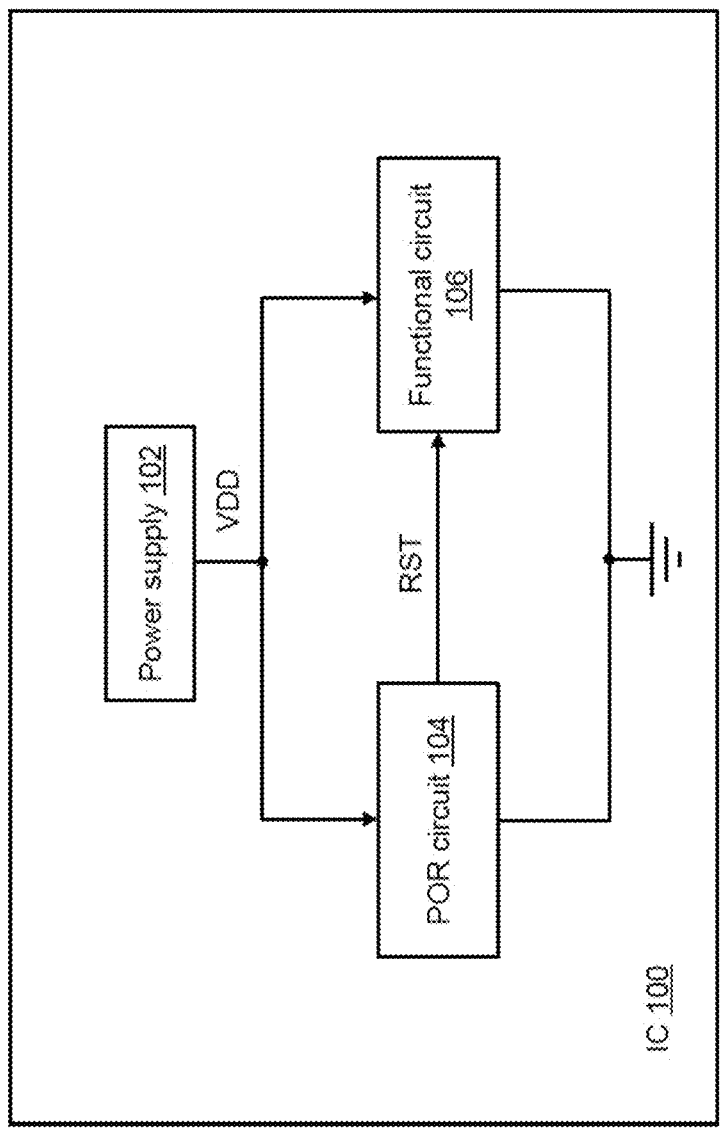
FIG. 1 illustrates a schematic block diagram of an integrated circuit (IC) in accordance with an embodiment of the present disclosure.

The detailed description of the appended drawings is intended as a description of the embodiments of the present disclosure, and is not intended to represent the only form in which the present disclosure may be practiced. It is to be understood that the same or equivalent functions may be accomplished by different embodiments that are intended to be encompassed within the spirit and scope of the present disclosure.

Overview

Conventionally, a reset signal, generated by a power-on reset (POR) circuit, is utilized to indicate that a supply voltage is above a trip value. For example, during a ramp-up of the supply voltage, the reset signal is de-asserted (e.g., is at a logic low state) when the supply voltage is less than the trip value, and when the supply voltage exceeds the trip value, the reset signal transitions from the de-asserted state to an asserted state (e.g., a logic high state). Similarly, during a ramp-down of the supply voltage, the reset signal transitions to the de-asserted state when the supply voltage falls below the trip value. The trip values during the ramp-up and the ramp-down may be different. Thus, various components of an integrated circuit (IC) may be non-operational (e.g., may be in a standby mode) when the reset signal is de-asserted, and may be operational exclusively when the reset signal is asserted. The POR circuit may include various transistors and inverters to enable the generation of the reset signal. Typically, in such a POR circuit, low impedance paths are created between the supply voltage and a ground terminal during a steady state of the supply voltage. In other words, such a POR circuit consumes a non-zero steady-state current, which leads to increased static power consumption. Other POR circuits that aim to achieve zero power falter in implementing trigger scenarios during both the ramp-up and ramp-down of the supply voltage.

Various embodiments of the present disclosure disclose an IC including a POR circuit. The POR circuit may generate a reset signal that is indicative of a state of a supply voltage. The POR circuit may include first and second diode circuits, first and second trip detector circuits, and a control circuit. The first and second diode circuits generate a trip node voltage and a reference voltage, respectively, based on the supply voltage. The trip node voltage and the reference voltage ramp up based on a ramp-up of the supply voltage, and are reduced versions of the supply voltage. The first trip detector circuit generates the reset signal based on the trip node voltage, whereas the second trip detector circuit generates a control signal based on the reference voltage and the supply voltage. The control circuit alters the trip node voltage based on the control signal, thereby controlling the logic state of the reset signal.

When the IC is powered up, the trip node voltage and the reference voltage follow the supply voltage, and are less than the supply voltage. At such an instance, the first and second trip detector circuits are deactivated (e.g., are not triggered). In other words, the reset signal and the control signal are de-asserted. As the control signal is de-asserted, the control circuit is deactivated (e.g., is not triggered). The reset signal remains de-asserted while the trip node voltage is less than a first threshold value, and transitions from the de-asserted state to the asserted state when the trip node voltage exceeds the first threshold value (e.g., when the supply voltage exceeds a trip-high value). The asserted state of the reset signal is thus indicative of the supply voltage being above a predefined level. Further, when the trip node voltage exceeds the first threshold value, the trip node voltage is adjusted to be equal to the supply voltage. For the remaining part of the ramp-up and during a steady state of the supply voltage, the trip node voltage remains equal to the supply voltage and the reset signal remains asserted. Additionally, during the ramp-up and the steady state of the supply voltage, the reference voltage remains less than the supply voltage, which results in the second trip detector circuit, and in turn, the control circuit remaining deactivated. During the ramp-down of the supply voltage, the supply voltage falls below the reference voltage. When the supply voltage is less than the reference voltage by a second threshold value (e.g., when the supply voltage falls below a trip-low value), the second trip detector circuit is activated and generates the control signal in an asserted state. The asserted state of the control signal activates the control circuit, and the activated control circuit controls the trip node voltage such that the trip node voltage is pulled down to a ground voltage. As a result, the reset signal transitions from the asserted state to the de-asserted state.

Thus, during the ramp-up of the supply voltage, the reset signal is de-asserted when the supply voltage is less than the trip-high value, and when the supply voltage exceeds the trip-high value, the reset signal transitions from the de-asserted state to the asserted state. For the remaining part of the ramp-up and during the steady state of the supply voltage, the reset signal remains asserted. Further, during the ramp-down of the supply voltage, the reset signal remains asserted when the supply voltage is greater than the trip-low value, and when the supply voltage falls below the trip-low value, the reset signal transitions from the asserted state to the de-asserted state. The reset signal is thus indicative of the state of the supply voltage. Consequently, the reset signal may be utilized by various functional circuits of the IC for executing associated operations.

Thus, the POR circuit of some embodiments of the present disclosure utilizes two separate trip detector circuits to enable the detection of the ramp-up and ramp-down trigger scenarios. The detection of the trigger points (especially, the trip-low value) in the present disclosure is different from that in some conventional POR circuits. Further, during the steady state, all the voltages and signals of the POR circuit are equal to the supply voltage or a ground voltage. In other words, low impedance paths between the supply voltage and the ground terminal are prevented during the steady state in the POR circuit of some embodiments of the present disclosure. As a result, the consumption of non-zero steady-state currents by the POR circuit is prevented. Consequently, the power consumption of the IC of some embodiments of the present disclosure is significantly less than that of an IC that includes some conventional POR circuits. As the POR circuit of some embodiments of the present disclosure is capable of detecting both the ramp-up and ramp-down trigger scenarios, whilst avoiding consumption of non-zero steady-state currents, the POR circuit of some embodiments of the present disclosure is significantly more efficient and accurate than some conventional POR circuits.

FIG. 1 illustrates a schematic block diagram of an integrated circuit (IC) 100 in accordance with an embodiment of the present disclosure. The IC 100 may include a power supply 102, a power-on reset (POR) circuit 104, and a functional circuit 106.

The power supply 102 may be configured to generate a supply voltage VDD. In an example, the supply voltage VDD is equal to 1.8 volts (V). However, the supply voltage VDD may have other values in other embodiments.

The POR circuit 104 may be coupled to the power supply 102 (e.g., a high supply voltage terminal) and a ground terminal (e.g., a low supply voltage terminal). The POR circuit 104 may be configured to receive the supply voltage VDD from the power supply 102 and generate a reset signal RST that may be indicative of a state of the supply voltage VDD. For example, during a ramp-up of the supply voltage VDD, the reset signal RST is de-asserted (e.g., is at a logic low state) when the supply voltage VDD is less than a trip-high value, and when the supply voltage VDD exceeds the trip-high value, the reset signal RST transitions from the de-asserted state to an asserted state (e.g., a logic high state). Further, for the remaining part of the ramp-up and during a steady state of the supply voltage VDD, the reset signal RST remains asserted. Additionally, during a ramp-down of the supply voltage VDD, the reset signal RST remains asserted when the supply voltage VDD is greater than a trip-low value, and when the supply voltage VDD falls below the trip-low value, the reset signal RST transitions from the asserted state to the de-asserted state.

The term "assert" is used to mean placing a signal in an active state. Some signals may be assert-high signals whereas some signals may be assert-low signals. With assert-high signals, the assertion of a signal corresponds to the signal being in a logic high state. Conversely, with assert-low signals, the assertion of a signal corresponds to the signal being in a logic low state. In the above example, the reset signal RST is an assert-high signal (e.g., the active state corresponds to a logic high state).

The trip-high and trip-low values do not vary significantly across different ramp rates of the supply voltage VDD. In an embodiment, the trip-high value is greater than the trip-low value. For example, the trip-high value may be equal to 0.9 V and the trip-low value may be equal to 0.7 V. However, the trip-high value and the trip-low value may be different in other embodiments.

Thus, in the POR circuit 104, the trigger points (e.g., the trip-high value and the trip-low value) are detected during both the ramp-up and ramp-down of the supply voltage VDD. Additionally, all the voltages and signals of the POR circuit 104 are equal to the supply voltage VDD or a ground voltage, during the steady state of the supply voltage VDD. As a result, the consumption of non-zero steady-state (e.g., quiescent) currents by the POR circuit 104 is prevented. In other words, during the steady state of the supply voltage VDD, the current consumption of the POR circuit 104 is null. The POR circuit 104 is thus capable of detecting both the ramp-up and ramp-down trigger scenarios, whilst avoiding consumption of non-zero steady-state currents, which renders the POR circuit 104 highly efficient and accurate as compared to some conventional POR circuits. The POR circuit 104 is explained in detail in conjunction with FIGS. 2 and 3.

The functional circuit 106 may be coupled to the power supply 102, the POR circuit 104, and the ground terminal. The functional circuit 106 may include suitable circuitry that may be configured to perform one or more operations. For example, the functional circuit 106 may be configured to receive the supply voltage VDD and the reset signal RST from the power supply 102 and the POR circuit 104, respectively. Based on the asserted state of the reset signal RST, the functional circuit 106 may be further configured to execute one or more operations associated therewith. Further, based on the de-asserted state of the reset signal RST, the functional circuit 106 may be configured to operate in a standby mode. Thus, the reset signal RST ensures that the functional circuit 106 is operational exclusively when the supply voltage VDD is within a desired range (e.g., a range that does not hamper the operations of the functional circuit 106). Examples of the functional circuit 106 may include an analog circuit, a digital circuit, a memory circuit, a sensor, an input/output circuit, a processor circuit, a communications circuit, or any combination thereof.

The functional circuit 106 is one exemplary functional circuit that may utilize the reset signal RST for its operation. The scope of the present disclosure is however not limited to it. In various other embodiments, the reset signal RST may be utilized by various other functional circuits of the IC 100, without deviating from the scope of the present disclosure.

Although FIG. 1 illustrates that all the circuits are implemented on the IC 100, the scope of the present disclosure is not limited to it. In various other embodiments, some circuits may be external to the IC 100. For example, in some embodiments, the power supply 102 may be external to the IC 100.

The scope of the present disclosure is not limited to the ground terminal being the low supply voltage terminal. In other embodiments, a voltage of the low supply voltage terminal may correspond to a non-zero value (e.g., −1 V, 1 V, or the like).

Figure 2:
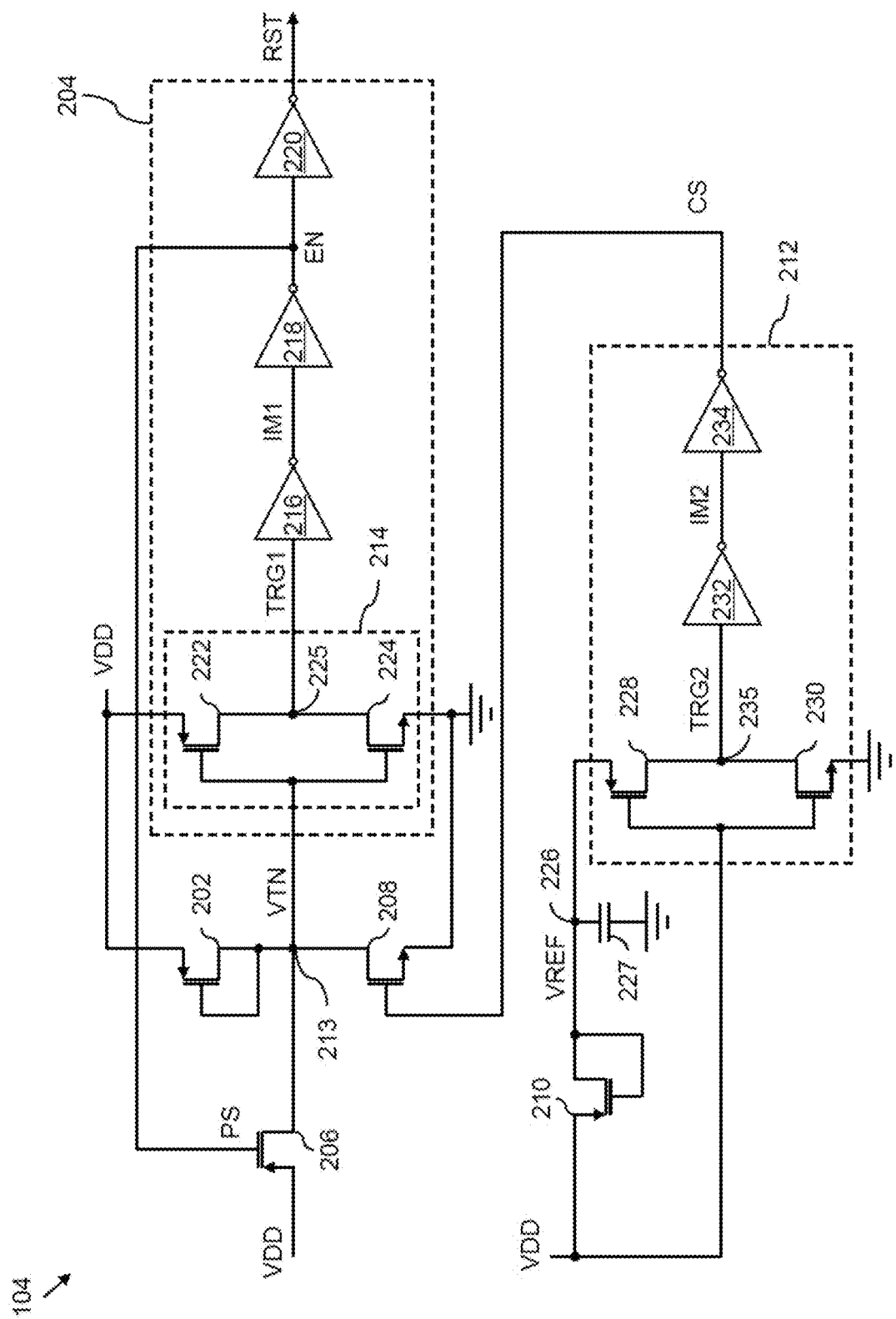
FIG. 2 illustrates a schematic circuit diagram of a power-on reset (POR) circuit of the IC of FIG. 1 in accordance with an embodiment of the present disclosure.

FIG. 2 illustrates a schematic circuit diagram of the POR circuit 104 in accordance with an embodiment of the present disclosure. The POR circuit 104 may include a first diode circuit 202, a first trip detector circuit 204, a first control transistor 206, a second control transistor 208, a second diode circuit 210, and a second trip detector circuit 212.

The first diode circuit 202 may be coupled to the power supply 102 and the first trip detector circuit 204. Examples of the first diode circuit 202 may include a diode, a diode-connected transistor, or the like. In the embodiment described below, the first diode circuit 202 is a diode-connected transistor. Hereinafter, the first diode circuit 202 is referred to as a "first diode-connected transistor 202". However, in other embodiments, the first diode circuit 202 may be implemented with a diode or other type of diode circuit (not shown). In an embodiment, the first diode-connected transistor 202 corresponds to a p-channel metal-oxide-semiconductor (PMOS) transistor. The first diode-connected transistor 202 may include first and second current terminals and a control terminal. In the present disclosure, the first and second current terminals of a transistor correspond to source and drain terminals of the transistor, respectively, and the control terminal corresponds to a gate terminal of the transistor.

The source terminal of the first diode-connected transistor 202 may be coupled to the power supply 102, and may be configured to receive the supply voltage VDD from the power supply 102. The drain terminal of the first diode-connected transistor 202 may be coupled to the gate terminal thereof, thereby resulting in a diode-connected transistor configuration. Thus, the source terminal of the first diode-connected transistor 202 may correspond to a first terminal of the first diode circuit 202, whereas the drain and gate terminals of the first diode-connected transistor 202 may correspond to a second terminal of the first diode circuit 202. The drain terminal of the first diode-connected transistor 202 may be further coupled to the first trip detector circuit 204, the first control transistor 206, and the second control transistor 208 at a trip node 213. Further, the first diode-connected transistor 202 may be configured to generate a trip node voltage VTN at the drain terminal thereof (e.g., at the trip node 213).

The trip node voltage VTN ramps up based on the ramp-up of the supply voltage VDD and is a reduced version of the supply voltage VDD (e.g., is less than the supply voltage VDD), until the supply voltage VDD exceeds the trip-high value. In an embodiment, the trip node voltage VTN is equal to a difference between the supply voltage VDD and a threshold voltage of the first diode-connected transistor 202, until the supply voltage VDD exceeds the trip-high value. When the supply voltage VDD exceeds the trip-high value, the trip node voltage VTN is adjusted to be equal to the supply voltage VDD. Such control of the trip node voltage VTN is executed by the first control transistor 206. The trip node voltage VTN remains equal to the supply voltage VDD until the supply voltage VDD falls below the trip-low value. At such an instance, the trip node voltage VTN may be pulled down to the ground terminal. Such control of the trip node voltage VTN is executed by the second control transistor 208.

The first trip detector circuit 204 may be coupled to the first diode-connected transistor 202 (e.g., the drain terminal of the first diode-connected transistor 202) and the first and second control transistors 206 and 208 at the trip node 213, the power supply 102, the functional circuit 106, and the ground terminal. The first trip detector circuit 204 may be configured to receive the supply voltage VDD and the trip node voltage VTN from the power supply 102 and the drain terminal of the first diode-connected transistor 202, respectively. Based on the supply voltage VDD and the trip node voltage VTN, the first trip detector circuit 204 may be further configured to generate the reset signal RST. Thus, the first trip detector circuit 204 may include an input terminal configured to receive the trip node voltage VTN and an output terminal configured to generate the reset signal RST. Further, the first trip detector circuit 204 may be configured to provide the reset signal RST to the functional circuit 106. To enable the generation of the reset signal RST, the first trip detector circuit 204 includes first through fourth inverters 214-220.

The first inverter 214 may be coupled to the first diode-connected transistor 202 (e.g., the drain terminal of the first diode-connected transistor 202), the power supply 102, and the ground terminal. The first inverter 214 may be configured to receive the supply voltage VDD and the trip node voltage VTN from the power supply 102 and the drain terminal of the first diode-connected transistor 202, respectively, and generate a first trigger signal TRG1 based on the trip node voltage VTN and the supply voltage VDD. The first trigger signal TRG1 is an assert-low signal. In an example, the first inverter 214 includes a high supply terminal configured to receive the supply voltage VDD, a low supply terminal coupled to the ground terminal, an input terminal configured to receive the trip node voltage VTN, and an output terminal configured to generate the first trigger signal TRG1.

The first inverter 214 may include first and second high-detection transistors 222 and 224. In an embodiment, the first high-detection transistor 222 corresponds to a PMOS transistor and the second high-detection transistor 224 corresponds to an n-channel metal-oxide-semiconductor (NMOS) transistor. Each of the first and second high-detection transistors 222 and 224 includes source, gate, and drain terminals. The source and gate terminals of the first high-detection transistor 222 may be coupled to the power supply 102 and the drain terminal of the first diode-connected transistor 202, and may be configured to receive the supply voltage VDD and the trip node voltage VTN from the power supply 102 and the drain terminal of the first diode-connected transistor 202, respectively. The source and gate terminals of the second high-detection transistor 224 may be coupled to the ground terminal and the gate terminal of the first high-detection transistor 222, respectively. Thus, the gate terminal of the second high-detection transistor 224 may be configured to receive the trip node voltage VTN. Further, the drain terminal of the first high-detection transistor 222 may be coupled to the drain terminal of the second high-detection transistor 224 at a first output node 225. The first output node 225 corresponds to the output terminal of the first inverter 214. The first inverter 214 generates the first trigger signal TRG1 at the output terminal thereof.

During the ramp-up of the supply voltage VDD, the first trigger signal TRG1 is de-asserted (e.g., is at a logic high state) when the trip node voltage VTN is less than the first threshold value. In other words, the trip node voltage VTN is equivalent to a logical '0', and hence, the output of the first inverter 214 (e.g., the first trigger signal TRG1) is a logical '1'. Further, when the trip node voltage VTN exceeds the first threshold value (e.g., is equivalent to a logical '1'), the first trigger signal TRG1 transitions from the de-asserted state (e.g., the logic high state) to the asserted state (e.g., the logic low state). In such a scenario, the first threshold value corresponds to a trip voltage of the first inverter 214. The first threshold value is thus a function of the supply voltage VDD, a threshold voltage of the first high-detection transistor 222, and a threshold voltage of the second high-detection transistor 224 as shown below in equation (1):

$$Vtrip = \left(\left(\frac{k}{k+1}\right)*(VDD - Vthp)\right) + \left(\left(\frac{1}{k+1}\right)*(Vthn)\right) \quad (1)$$

where,

Vtrip is the trip voltage of the first inverter 214,

Vthp is the threshold voltage of the first high-detection transistor 222,

Vthn is the threshold voltage of the second high-detection transistor 224, $$k = \frac{\sqrt{\mu_p * C_{oxp} * \left(\frac{W}{L}\right)_p}}{\sqrt{\mu_n * C_{oxn} * \left(\frac{W}{L}\right)_n}},$$

$\mu_p$ is the mobility of the first high-detection transistor 222,
$C_{oxp}$ is the oxide capacitance of the first high-detection transistor 222, $$\left(\frac{W}{L}\right)_p$$

is the aspect ration of the first high-detection transistor 222,
$\mu_n$ is the mobility of the second high-detection transistor 224,
$C_{oxn}$ is the oxide capacitance of the second high-detection transistor 224, $$\left(\frac{W}{L}\right)_n$$

is the aspect ration of the second high-detection transistor 224.

The first threshold value is thus also a function of the mobility, oxide capacitance, and aspect ratio of each of the first high-detection transistor 222 and the second high-detection transistor 224.

Based on the transition of the first trigger signal TRG1 (e.g., based on the trip node voltage VTN exceeding the first threshold value), the trip node voltage VTN is adjusted to be equal to the supply voltage VDD. The adjustment of the trip node voltage VTN based on the transition of the first trigger signal TRG1 is explained in detail below. For the remaining part of the ramp-up and during the steady state of the supply voltage VDD, the first trigger signal TRG1 remains asserted and the trip node voltage VTN remains equal to the supply voltage VDD. Further, during the ramp-down of the supply voltage VDD, the first trigger signal TRG1 transitions from the asserted state to the de-asserted state when the trip node voltage VTN is pulled down to the ground terminal.

The second inverter 216 may be coupled to the first inverter 214 (e.g., the drain terminals of the first and second high-detection transistors 222 and 224). The second inverter 216 may be configured to receive the first trigger signal TRG1 from the first inverter 214 and generate a first intermediate signal IM1 that is an inverted version of the first trigger signal TRG1. The first intermediate signal IM1 is thus an assert-high signal. Thus, the second inverter 216 may include an input terminal that is coupled to the output terminal of the first inverter 214, and an output terminal configured to generate the first intermediate signal IM1. Similarly, the third inverter 218 may be coupled to the second inverter 216, and may be configured to receive the first intermediate signal IM1 from the second inverter 216. The third inverter 218 may be further configured to generate an enable signal EN that is an inverted version of the first intermediate signal IM1. Thus, the third inverter 218 may include an input terminal that is coupled to the output terminal of the second inverter 216, and an output terminal configured to generate the enable signal EN. The enable signal EN is thus logically equivalent to the first trigger signal TRG1. Further, the enable signal EN is an assert-low signal. The trip node voltage VTN is adjusted to be equal to the supply voltage VDD based on a logic state of the enable signal EN, as explained in detail below. The fourth inverter 220 may be coupled to the third inverter 218, and may be configured to receive the enable signal EN from the third inverter 218. The fourth inverter 220 may be further configured to generate the reset signal RST, that is an inverted version of the enable signal EN. In other words, the reset signal RST is an inverted version of the first trigger signal TRG1. The reset signal RST is thus an assert-high signal. Thus, the fourth inverter 220 may include an input terminal that is coupled to the output terminal of the third inverter 218, and an output terminal configured to generate the reset signal RST.

The second through fourth inverters 216-220 may be structurally similar to the first inverter 214 illustrated in FIG. 2, and the components of each of the second through fourth inverters 216-220 are not shown in FIG. 2 so as to not obscure the illustration. Further, although not shown in FIG. 2, the second through fourth inverters 216-220 may be configured to receive the supply voltage VDD and the ground voltage at supply terminals thereof for performing the corresponding inverting operations.

Thus, during the ramp-up of the supply voltage VDD, the trip node voltage VTN follows the supply voltage VDD and is less than the supply voltage VDD. When the trip node voltage VTN is less than the first threshold value, the first trigger signal TRG1 is de-asserted (e.g., is at the logic high state) and the reset signal RST is de-asserted (e.g., is at the logic low state). Further, when the trip node voltage VTN exceeds the first threshold value during the ramp-up, the first trigger signal TRG1 transitions from the de-asserted state to the asserted state (e.g., the logic low state), and consequently, the reset signal RST transitions from the de-asserted state to the asserted state (e.g., the logic high state). The trip-high value thus corresponds to a value of the supply voltage VDD at which the trip node voltage VTN exceeds the first threshold value. In other words, during the ramp-up of the supply voltage VDD, the trip node voltage VTN is the reduced version of the supply voltage VDD (e.g., is equal to the difference between the supply voltage VDD and the threshold voltage of the first diode-connected transistor 202), until the trip node voltage VTN exceeds the first threshold value. Further, when the trip node voltage VTN exceeds the first threshold value, the trip node voltage VTN is adjusted to be equal to the supply voltage VDD. Such an adjustment of the trip node voltage VTN prevents the creation of low impedance paths between the supply voltage VDD (e.g., the power supply 102) and the ground terminal in the first trip detector circuit 204.

To control the adjustment of the trip node voltage VTN, the first trip detector circuit 204 (e.g., the third inverter 218) generates the enable signal EN. During the ramp-up of the supply voltage VDD, the enable signal EN is de-asserted (e.g., is at the logic high state) when the trip node voltage VTN is less than the first threshold value and transitions from the de-asserted state to the asserted state (e.g., the logic low state) when the trip node voltage VTN exceeds the first threshold value. The enable signal EN remains asserted for the remaining part of the ramp-up and during the steady state of the supply voltage VDD. Further, during the ramp-down of the supply voltage VDD, the enable signal EN transitions from the asserted state to the de-asserted state when the trip node voltage VTN is pulled down to the ground terminal.

The first trip detector circuit 204 may be further configured to provide the enable signal EN to the first control transistor 206. In an embodiment, the first control transistor 206 corresponds to a PMOS transistor. The first control transistor 206 may include source, gate, and drain terminals. The source and gate terminals of the first control transistor 206 may be coupled to the power supply 102 and the first trip detector circuit 204 (e.g., the third inverter 218), and may be configured to receive the supply voltage VDD and the enable signal EN from the power supply 102 and the first trip detector circuit 204, respectively. Further, the drain terminal of the first control transistor 206 may be coupled to the first trip detector circuit 204 (e.g., the gate terminals of the first and second high-detection transistors 222 and 224) and the drain terminal of the first diode-connected transistor 202 at the trip node 213.

The enable signal EN controls the first control transistor 206 such that the first control transistor 206 is activated and deactivated when the enable signal EN is asserted and de-asserted, respectively. Thus, during the ramp-up of the supply voltage VDD, when the trip node voltage VTN is less than the first threshold value (e.g., when the enable signal EN is de-asserted), the first control transistor 206 is deactivated. When the trip node voltage VTN exceeds the first threshold value (e.g., when the enable signal EN transitions to the asserted state), the first control transistor 206 is activated and may be configured to control the trip node voltage VTN such that the trip node voltage VTN is equal to the supply voltage VDD. For the remaining part of the ramp-up and during the steady state of the supply voltage VDD, the trip node voltage VTN remains equal to the supply voltage VDD, the first trigger signal TRG1 remains asserted (e.g., at the logic low state), the enable signal EN remains asserted (e.g., at the logic low state), and the reset signal RST remains asserted (e.g., at the logic high state). Further, during the ramp-down of the supply voltage VDD, when the supply voltage VDD falls below the trip-low value, the trip node voltage VTN is pulled down to the ground terminal. At such an instance, the first trigger signal TRG1 is de-asserted (e.g., is at the logic high state), the enable signal EN is de-asserted (e.g., is at the logic high state), and the reset signal RST is de-asserted (e.g., is at the logic low state).

The second control transistor 208 (also corresponds to and referred to as a "control circuit 208") may be configured to control the trip node voltage VTN during the ramp-down of the supply voltage VDD. In an embodiment, the second control transistor 208 corresponds to an NMOS transistor. The second control transistor 208 may include source, gate, and drain terminals. The source terminal of the second control transistor 208 may be coupled to the ground terminal, whereas the drain terminal of the second control transistor 208 may be coupled to the drain terminals of the first diode-connected transistor 202 and the first control transistor 206, and the gate terminals of the first and second high-detection transistors 222 and 224 at the trip node 213. The gate terminal of the second control transistor 208 may be configured to receive a control signal CS that controls an operation thereof. The control signal CS is an assert-high signal. The control signal CS controls the second control transistor 208 such that the second control transistor 208 is activated and deactivated when the control signal CS is asserted and de-asserted, respectively.

During the ramp-up and the steady state of the supply voltage VDD, the control signal CS remains de-asserted, and as a result, the second control transistor 208 remains deactivated. During the ramp-down of the supply voltage, the control signal CS transitions from the de-asserted state to the asserted state when the supply voltage VDD falls below the trip-low value. The second control transistor 208 is thus activated and may be configured to control the trip node voltage VTN such that the trip node voltage VTN is pulled down to the ground terminal. In an embodiment, a drive strength of the second control transistor 208 is greater than the drive strength of the first control transistor 206, and hence, although the first control transistor 206 is activated, the trip node voltage VTN is pulled down to the ground terminal.

When the trip node voltage VTN is pulled down to the ground terminal, each of the first trigger signal TRG1 and the enable signal EN transitions from the asserted state to the de-asserted state. As a result, the first control transistor 206 is deactivated. Further, the reset signal RST transitions from the asserted state to the de-asserted state. The reset signal RST thus provides an accurate indication of the state of the supply voltage VDD.

In the POR circuit 104, the generation of the control signal CS is enabled by the second diode circuit 210 and the second trip detector circuit 212.

The second diode circuit 210 may be coupled to the power supply 102 and the second trip detector circuit 212. Examples of the second diode circuit 210 may include a diode, a diode-connected transistor, or the like. In the embodiment described below, the second diode circuit 210 is a diode-connected transistor. Hereinafter, the second diode circuit 210 is referred to as a "second diode-connected transistor 210". However, in other embodiments, the second diode circuit 210 may be implemented with a diode or other type of diode circuit (not shown). In an embodiment, the second diode-connected transistor 210 corresponds to a PMOS transistor. The second diode-connected transistor 210 may include source, gate, and drain terminals.

The source terminal of the second diode-connected transistor 210 may be coupled to the power supply 102, and may be configured to receive the supply voltage VDD from the power supply 102. The drain terminal of the second diode-connected transistor 210 may be coupled to the gate terminal thereof, thereby resulting in the diode-connected transistor configuration. Thus, the source terminal of the second diode-connected transistor 210 may correspond to a first terminal of the second diode circuit 210, whereas the drain and gate terminals of the second diode-connected transistor 210 may correspond to a second terminal of the second diode circuit 210. The drain terminal of the second diode-connected transistor 210 may be further coupled to the second trip detector circuit 212 at a reference node 226. Further, the second diode-connected transistor 210 may be configured to generate a reference voltage VREF at the drain terminal thereof (e.g., at the reference node 226). In the present disclosure, the second diode-connected transistor 210 may correspond to and may also be referred to as a "reference generating circuit 210". Thus, the reference generating circuit 210 may include an input terminal configured to receive the supply voltage VDD and an output terminal configured to generate the reference voltage VREF.

The reference voltage VREF ramps up based on the ramp-up of the supply voltage VDD and is a reduced version of the supply voltage VDD (e.g., is less than the supply voltage VDD), during the ramp-up and the steady state of the supply voltage VDD. In an embodiment, the reference voltage VREF is equal to a difference between the supply voltage VDD and a threshold voltage of the second diode-connected transistor 210, during the ramp-up and the steady state of the supply voltage VDD. Thus, before the supply voltage VDD ramps down, the reference voltage VREF is settled at a value that is less than the supply voltage VDD. In an embodiment, the POR circuit 104 may include a capacitor 227 that is coupled between the drain terminal of the second diode-connected transistor 210 and the ground terminal. For example, the capacitor 227 may include a first electrode coupled to the drain terminal of the second diode-connected transistor 210 at the reference node 226, and a second electrode coupled to the ground terminal. The capacitor 227 may store the settled value of the reference voltage VREF at the end of the steady state of the supply voltage VDD.

During the ramp-down of the supply voltage VDD, the supply voltage VDD reduces while the reference voltage VREF (e.g., the voltage at the drain terminal of the second diode-connected transistor 210) is retained by way of the capacitor 227. In other words, the supply voltage VDD falls below the reference voltage VREF at least for a portion of the ramp-down of the supply voltage VDD. The reduction of the supply voltage VDD and the retention of the reference voltage VREF results in the second diode-connected transistor 210 being deactivated. In such a scenario, the second trip detector circuit 212 is activated (e.g., is triggered) when the supply voltage VDD is less than the reference voltage VREF by a second threshold value. The trip-low value thus corresponds to a value of the supply voltage VDD at which the supply voltage VDD falls below the reference voltage VREF by the second threshold value. At such an instance, the retained reference voltage VREF is utilized for transitioning the state of the control signal CS.

The second trip detector circuit 212 may be coupled to the second diode-connected transistor 210 (e.g., the drain terminal of the second diode-connected transistor 210) at the reference node 226, the power supply 102, the second control transistor 208 (e.g., the gate terminal of the second control transistor 208), and the ground terminal. The second trip detector circuit 212 may be configured to receive the supply voltage VDD and the reference voltage VREF from the power supply 102 and the drain terminal of the second diode-connected transistor 210, respectively. Based on the supply voltage VDD and the reference voltage VREF, the second trip detector circuit 212 may be further configured to generate the control signal CS. Thus, the second trip detector circuit 212 may include an input terminal configured to receive the supply voltage VDD and an output terminal configured to generate the control signal CS. Further, the second trip detector circuit 212 may be configured to provide the control signal CS to the gate terminal of the second control transistor 208. To enable the generation of the control signal CS, the second trip detector circuit 212 may include first and second low-detection transistors 228 and 230, a fifth inverter 232, and a sixth inverter 234.

The first and second low-detection transistors 228 and 230 enable the detection of the trip-low trigger point of the supply voltage VDD. In an embodiment, the first low-detection transistor 228 corresponds to a PMOS transistor and the second low-detection transistor 230 corresponds to an NMOS transistor. Each of the first and second low-detection transistors 228 and 230 may include source, gate, and drain terminals. The source and gate terminals of the first low-detection transistor 228 may be coupled to the drain terminal of the second diode-connected transistor 210 and the power supply 102, and may be configured to receive the reference voltage VREF and the supply voltage VDD from the drain terminal of the second diode-connected transistor 210 and the power supply 102, respectively. The source and gate terminals of the second low-detection transistor 230 may be coupled to the ground terminal and the gate terminal of the first low-detection transistor 228, respectively. Thus, the gate terminal of the second low-detection transistor 230 may be configured to receive the supply voltage VDD. Further, the drain terminal of the first low-detection transistor 228 may be coupled to the drain terminal of the second low-detection transistor 230 at a second output node 235. The first and second low-detection transistors 228 and 230 may be configured to generate a second trigger signal TRG2 at the second output node 235. The second trigger signal TRG2 is an assert-high signal. The first and second low-detection transistors 228 and 230 thus constitute a seventh inverter having a high supply terminal configured to receive the reference voltage VREF, a low supply terminal coupled to the ground terminal, an input terminal configured to receive the supply voltage VDD, and an output terminal configured to generate the second trigger signal TRG2.

During the ramp-up and the steady state of the supply voltage VDD, the supply voltage VDD is greater than the reference voltage VREF. Thus, the first low-detection transistor 228 is deactivated and the second low-detection transistor 230 is activated (e.g., when the supply voltage VDD is greater than a threshold voltage of the second low-detection transistor 230). As a result, the second trigger signal TRG2 is de-asserted (e.g., is at the logic low state). Further, during the ramp-down of the supply voltage VDD, the supply voltage VDD falls below the reference voltage VREF (e.g., the voltage stored in the capacitor 227). When the supply voltage VDD is less than the reference voltage VREF by the second threshold value, the first low-detection transistor 228 is activated and the second low-detection transistor 230 is deactivated. As a result, the second trigger signal TRG2 transitions from the de-asserted state to the asserted state (e.g., the logic high state). In such a scenario, the second threshold value corresponds to a trip voltage of the seventh inverter. The second threshold value is thus a function of the supply voltage VDD, a threshold voltage of the first low-detection transistor 228, and a threshold voltage of the second low-detection transistor 230 in a similar manner as described above in equation (1). In other words, the second threshold value corresponds to a voltage difference between the reference voltage VREF and the supply voltage VDD that is sufficient to cause a drive strength of the first low-detection transistor 228 to be greater than a drive strength of the second low-detection transistor 230, thereby enabling the pulling up of the second trigger signal TRG2 to the asserted state.

The fifth inverter 232 may be coupled to the drain terminals of the first and second low-detection transistors 228 and 230 at the second output node 235. The fifth inverter 232 may be configured to receive the second trigger signal TRG2 from the drain terminals of the first and second low-detection transistors 228 and 230, and generate a second intermediate signal IM2 that is an inverted version of the second trigger signal TRG2. The second intermediate signal IM2 is thus an assert-low signal. Thus, the fifth inverter 232 may include an input terminal that is coupled to the output terminal of the seventh inverter, and an output terminal configured to generate the second intermediate signal IM2. The sixth inverter 234 may be coupled to the fifth inverter 232, and may be configured to receive the second intermediate signal IM2 from the fifth inverter 232. Further, the sixth inverter 234 may be configured to generate the control signal CS, that is an inverted version of the second intermediate signal IM2. The control signal CS is thus logically equivalent to the second trigger signal TRG2. Thus, the sixth inverter 234 may include an input terminal that is coupled to the output terminal of the fifth inverter 232, and an output terminal configured to generate the control signal CS.

The fifth and sixth inverters 232 and 234 may be structurally similar to the first inverter 214 illustrated in FIG. 2, and the components of each of the fifth and sixth inverters 232 and 234 are not shown in FIG. 2 so as to not obscure the illustration. Further, although not shown in FIG. 2, the fifth and sixth inverters 232 and 234 may be configured to receive the supply voltage VDD and the ground voltage at supply terminals thereof for performing the corresponding inverting operations.

Thus, during the ramp-up and the steady state of the supply voltage VDD, the reference voltage VREF follows the supply voltage VDD and is less than the supply voltage VDD. As a result, the control signal CS remains de-asserted. During the ramp-down of the supply voltage VDD, the supply voltage VDD falls below the reference voltage VREF. When the supply voltage VDD is less than the reference voltage VREF by the second threshold value, the second trigger signal TRG2, and in turn, the control signal CS transition from the de-asserted state to the asserted state. Based on the assertion of the control signal CS, the second control transistor 208 (e.g., the control circuit 208) may be configured to alter the trip node voltage VTN (e.g., pull down the trip node voltage VTN to the ground terminal) such that the reset signal RST transitions from the asserted state to the de-asserted state.

Figure 3:
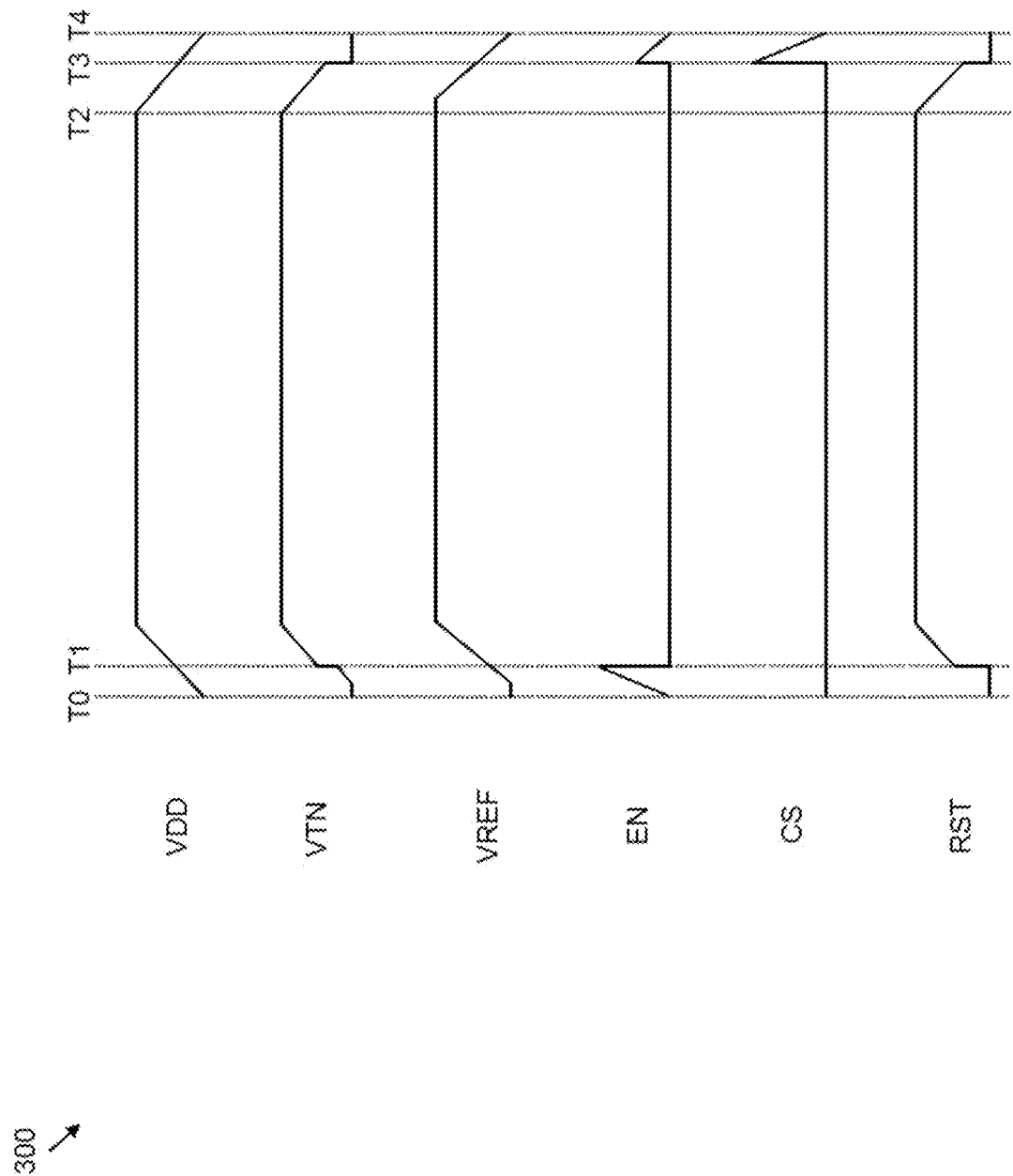
FIG. 3 represents a timing diagram that illustrates an operation of the POR circuit in accordance with an embodiment of the present disclosure.

The operation of the POR circuit 104 is explained in detail in conjunction with FIG. 3.

The scope of the present disclosure is not limited to the first and second trip detector circuits 204 and 212 being implemented in the above-described manner. In various other embodiments, different or additional components may be utilized for implementing the first and second trip detector circuits 204 and 212, without deviating from the scope of the present disclosure.

Although FIG. 2 describes the utilization of a transistor as a control circuit and the utilization of a diode-connected transistor as a reference generating circuit, the scope of the present disclosure is not limited to it. In various other embodiments, different or additional components may be utilized for implementing a control circuit and a reference generating circuit, without deviating from the scope of the present disclosure.

FIG. 3 represents a timing diagram 300 that illustrates the operation of the POR circuit 104 in accordance with an embodiment of the present disclosure.

At time instance T0, the IC 100 is powered up. During a time period T0-T1, the supply voltage VDD ramps up. As the trip node voltage VTN and the reference voltage VREF follow the supply voltage VDD and are reduced versions of the supply voltage VDD, the trip node voltage VTN and the reference voltage VREF ramp up during the time period T0-T1 and are less than the supply voltage VDD. The trip node voltage VTN is less than the first threshold value, and hence, the first trigger signal TRG1, and in turn, the enable signal EN are at the logic high state. As a result, the first control transistor 206 is deactivated. Further, as the reference voltage VREF is less than the supply voltage VDD, the second trigger signal TRG2, and in turn, the control signal CS are at the logic low state. As a result, the second control transistor 208 is deactivated. Additionally, the reset signal RST is de-asserted.

At time instance T1, the trip node voltage VTN exceeds the first threshold value. In other words, the supply voltage VDD exceeds the trip-high value at the time instance T1. Further, at the time instance T1, the enable signal EN transitions from the logic high state to the logic low state, and consequently, the reset signal RST transitions from the logic low state to the logic high state. The reference voltage VREF remains less than the supply voltage VDD, and hence, the control signal CS remains at the logic low state. Further, as the enable signal EN transitions to the logic low state, the first control transistor 206 is activated and the trip node voltage VTN is adjusted to be equal to the supply voltage VDD.

During a time period T1-T2, the trip node voltage VTN remains equal to the supply voltage VDD, whereas the reference voltage VREF follows and is less than the supply voltage VDD. Thus, the pulse and control signals EN and CS remain at the logic low state, and the reset signal RST remains at the logic high state. In the timing diagram 300, the reset signal RST at the logic high state is indicated to be following the supply voltage VDD. However, the scope of the present disclosure is not limited to it.

At time instance T2, the supply voltage VDD starts to ramp down. During a time period T2-T3, while the supply voltage VDD reduces, the reference voltage VREF is retained by way of the capacitor 227. In other words, the supply voltage VDD falls below the reference voltage VREF. During the time period T2-T3, the difference between the supply voltage VDD and the reference voltage VREF is not sufficient to activate the first low-detection transistor 228. Thus, the control signal CS remains at the logic low state. Further, the enable signal EN remains at the logic low state and the reset signal RST remains at the logic high state.

At time instance T3, the supply voltage VDD is less than the reference voltage VREF by the second threshold value. In other words, the supply voltage VDD falls below the trip-low value at the time instance T3. Further, at time instance T3, the first low-detection transistor 228 is activated and the second low-detection transistor 230 is deactivated. As a result, the control signal CS transitions to the logic high state, thereby activating the second control transistor 208. Consequently, the trip node voltage VTN is pulled down to the ground terminal. In response, the enable signal EN transitions to the logic high state, and consequently, the reset signal RST transitions to the logic low state.

During a time period T3-T4, the supply voltage VDD ramps down to the ground terminal and the IC 100 is shut down.

As illustrated in the timing diagram 300, the trip-high value is greater than the trip-low value, thereby providing hysteresis in the POR circuit 104. The distinct trip-high and trip-low values may be achieved by controlling the sizes of various transistors of the POR circuit 104.

Thus, in some embodiments of the present disclosure, the POR circuit 104 utilizes two separate trip detector circuits (e.g., the first and second trip detector circuits 204 and 212) for enabling the detection of the ramp-up and ramp-down trigger scenarios. The utilization of the combination of the second diode-connected transistor 210 and the second trip detector circuit 212 for detecting the low trigger point (e.g., the trip-low value) distinguishes the POR circuit 104 from some conventional POR circuits that utilize different techniques for enabling trip-low trigger point detection. Further, during the steady state of the supply voltage VDD, all the voltages and signals of the POR circuit 104 are equal to the supply voltage VDD or the ground voltage. In other words, low impedance paths between the supply voltage VDD (e.g., the power supply 102) and the ground terminal are prevented during the steady state in the POR circuit 104. As a result, the consumption of non-zero steady-state currents by the POR circuit 104 is prevented. Consequently, the power consumption of the IC 100 is significantly less than that of an IC that includes some conventional POR circuits. Further, the POR circuit 104 includes a few inverters and transistors to enable the generation of the reset signal RST, and hence, is not area intensive. As the POR circuit 104 is capable of detecting both the ramp-up and ramp-down trigger scenarios, whilst avoiding consumption of non-zero steady-state currents, the POR circuit 104 is significantly more efficient and accurate than some conventional POR circuits.

In an embodiment of the present disclosure, the IC 100 is disclosed. The IC 100 may include the POR circuit 104 that may be configured to generate the reset signal RST. The reset signal RST is indicative of the state of the supply voltage VDD. The POR circuit 104 may include the first trip detector circuit 204, the reference generating circuit 210, the second trip detector circuit 212, and the control circuit 208. The first trip detector circuit 204 may include an input terminal configured to receive the trip node voltage VTN of the trip node 213. The trip node voltage VTN ramps up based on the ramp-up of the supply voltage VDD. Further, the first trip detector circuit 204 may include an output terminal configured to generate the reset signal RST based on the trip node voltage VTN. During the ramp-up of the supply voltage VDD, the reset signal RST is de-asserted when the trip node voltage VTN is less than the first threshold value, and the reset signal RST transitions from the de-asserted state to the asserted state when the trip node voltage VTN exceeds the first threshold value. The reference generating circuit 210 may include an input terminal configured to receive the supply voltage VDD and an output terminal configured to generate the reference voltage VREF. The reference voltage VREF is a reduced version of the supply voltage VDD during the ramp-up and the steady state of the supply voltage VDD. Further, during at least a portion of the ramp-down of the supply voltage VDD, the supply voltage VDD falls below the reference voltage VREF. The second trip detector circuit 212 may be coupled to the output terminal of the reference generating circuit 210. The second trip detector circuit 212 may include an output terminal configured to generate the control signal CS based on the reference voltage VREF and the supply voltage VDD. During the ramp-down of the supply voltage VDD, the control signal CS transitions from the de-asserted state to the asserted state when the supply voltage VDD is less than the reference voltage VREF by the second threshold value. The control circuit may be coupled to the trip node 213 and the second trip detector circuit 212. Based on the transition of the control signal CS, the control circuit 208 may be configured to alter the trip node voltage VTN such that the reset signal RST transitions from the asserted state to the de-asserted state.

In another embodiment of the present disclosure, the IC 100 is disclosed. The IC 100 may include the POR circuit 104 that may be configured to generate the reset signal RST. The reset signal RST is indicative of the state of the supply voltage VDD. The POR circuit 104 may include the first diode circuit 202, the first inverter 214, the second diode circuit 210, the first and second low-detection transistors 228 and 230, and the second control transistor 208. Each of the first and second diode circuits 202 and 210 may include the first and second terminals. Each of the first and second low-detection transistors 228 and 230 and the second control transistor 208 may include the first current terminal (e.g., a source terminal), the control terminal (e.g., a gate terminal), and the second current terminal (e.g., a drain terminal). The first terminal of each of the first and second diode circuits 202 and 210 may be configured to receive the supply voltage VDD. The first inverter 214 may include a first supply terminal (e.g., the high supply terminal) configured to receive the supply voltage VDD, an input terminal coupled to the second terminal of the first diode circuit 202, and an output terminal configured to generate the first trigger signal TRG1. The first current terminals of the first and second low-detection transistors 228 and 230 may be coupled to the second current terminal of the second diode circuit 210 and the low supply voltage terminal, respectively. The control terminals of the first and second low-detection transistors 228 and 230 may be configured to receive the supply voltage VDD. Further, the second current terminal of the first low-detection transistor 228 may be coupled to the second current terminal of the second low-detection transistor 230. The second current terminal of the second control transistor 208 may be coupled to the second current terminal of the first diode circuit 202. Further, the control terminal of the second control transistor 208 may be coupled to the second current terminal of the first low-detection transistor 228 by way of the fifth and sixth inverters 232 and 234. The reset signal RST is an inverted version of the first trigger signal TRG1.

In some embodiments, the POR circuit 104 may further include the first diode circuit 202 that may include the first and second terminals. The first terminal of the first diode circuit 202 may be configured to receive the supply voltage VDD. Further, the second terminal of the first diode circuit 202 may be coupled to the trip node 213. The first diode circuit 202 may be configured to generate the trip node voltage VTN at the second terminal thereof. The trip node voltage VTN ramps up based on the ramp-up of the supply voltage VDD and is the reduced version of the supply voltage VDD, until the trip node voltage VTN exceeds the first threshold value.

In some embodiments, during the ramp-up of the supply voltage VDD, the trip node voltage VTN is equal to the difference between the supply voltage VDD and the threshold voltage associated with the first diode circuit 202 (e.g., the threshold voltage of the first diode-connected transistor 202), until the trip node voltage VTN exceeds the first threshold value.

In some embodiments, during the ramp-up of the supply voltage VDD, the trip node voltage VTN is less than the supply voltage VDD, until the trip node voltage VTN exceeds the first threshold value. When the trip node voltage VTN exceeds the first threshold value, the trip node voltage VTN is adjusted to be equal to the supply voltage VDD.

In some embodiments, the POR circuit 104 may further include the first control transistor 206 including the first and second current terminals and the control terminal. The first current terminal and the control terminal of the first control transistor 206 may be configured to receive the supply voltage VDD and the enable signal EN, respectively. Further, the second current terminal of the first control transistor 206 may be coupled to the trip node 213. The first control transistor 206 may be configured to control the trip node voltage VTN such that when the first control transistor 206 is activated, the trip node voltage VTN is equal to the supply voltage VDD. The first control transistor 206 may be activated when the enable signal EN is asserted. The enable signal EN may be de-asserted when the trip node voltage VTN is less than the first threshold value and transitions from the de-asserted state to the asserted state when the trip node voltage VTN exceeds the first threshold value.

In some embodiments, the control circuit 208 may include the second control transistor 208 that includes the first and second current terminals and the control terminal. The first and second current terminals of the second control transistor 208 may be coupled to the low supply voltage terminal and the trip node 213, respectively. Further, the control terminal of the second control transistor 208 may be coupled to the second trip detector circuit 212, and may be configured to receive the control signal CS from the second trip detector circuit 212. The second control transistor 208 may be configured to control the trip node voltage VTN such that when the second control transistor 208 is activated, the trip node voltage VTN is pulled down to a voltage of the low supply voltage terminal. The second control transistor 208 is activated based on the assertion of the control signal CS.

In some embodiments, the first trip detector circuit 204 may include the first inverter 214 that may be configured to generate the first trigger signal TRG1 based on the trip node voltage VTN. During the ramp-up of the supply voltage VDD, the first trigger signal TRG1 is de-asserted when the trip node voltage VTN is less than the first threshold value, and when the trip node voltage VTN exceeds the first threshold value, the first trigger signal TRG1 transitions from the de-asserted state to the asserted state. Based on the transition of the first trigger signal TRG1, the trip node voltage VTN is adjusted to be equal to the supply voltage VDD. The first trigger signal TRG1 remains asserted and the trip node voltage VTN remains equal to the supply voltage VDD, during the steady state of the supply voltage VDD. During the ramp-down of the supply voltage VDD, the first trigger signal TRG1 transitions from the asserted state to the de-asserted state when the trip node voltage VTN is pulled down to the ground terminal.

In some embodiments, the first trip detector circuit 204 may further include the second and third inverters 216 and 218. The second inverter 216 may include an input terminal that is coupled to an output terminal of the first inverter 214, and configured to receive the first trigger signal TRG1, and an output terminal configured to generate the first intermediate signal IM1 that is the inverted version of the first trigger signal TRG1. The third inverter 218 may include an input terminal that is coupled to the output terminal of the second inverter 216, and configured to receive the first intermediate signal IM1, and an output terminal configured to generate the enable signal EN that is the inverted version of the first intermediate signal IM1. The enable signal EN is thus logically equivalent to the first trigger signal TRG1.

The trip node voltage VTN is adjusted to be equal to the supply voltage VDD based on the logic state of the enable signal EN.

In some embodiments, the first trip detector circuit 204 may further include the fourth inverter 220 that may be configured to generate the reset signal RST that is the inverted version of the first trigger signal TRG1.

In some embodiments, the first inverter 214 generates the first trigger signal TRG1 at the output terminal thereof. The first inverter 214 may include the first and second high-detection transistors 222 and 224, each including the first and second current terminals and the control terminal. The first current terminal of the first high-detection transistor 222 may be configured to receive the supply voltage VDD, whereas the first current terminal of the second high-detection transistor 224 may be coupled to the low supply voltage terminal. The control terminals of the first and second high-detection transistors 222 and 224 may be configured to receive the trip node voltage VTN. Further, the second current terminal of the first high-detection transistor 222 may be coupled to the second current terminal of the second high-detection transistor 224 at the first output node 225. The first output node 225 corresponds to the output terminal of the first inverter 214. The first threshold value may be a function of the supply voltage VDD, the threshold voltage of the first high-detection transistor 222, and the threshold voltage of the second high-detection transistor 224.

In some embodiments, during the ramp-up of the supply voltage VDD, when the trip node voltage VTN is less than the first threshold value, the first and second control transistors 206 and 208 are deactivated. Further, when the trip node voltage VTN exceeds the first threshold value, the first control transistor 206 is activated and may be configured to control the trip node voltage VTN such that the trip node voltage VTN is equal to the supply voltage VDD. During the ramp-down of the supply voltage VDD, when the supply voltage VDD is less than the reference voltage VREF by the second threshold value, the second control transistor 208 is activated. The drive strength of the second control transistor 208 is greater than the drive strength of the first control transistor 206, and as a result, when the second control transistor 208 is activated, the second control transistor 208 may be configured to control the trip node voltage VTN such that the trip node voltage VTN is pulled down to the voltage of the low supply voltage terminal.

In some embodiments, the reference generating circuit 210 comprises the second diode circuit 210. The second diode circuit 210 comprises the first terminal configured to receive the supply voltage VDD, and the second terminal coupled to the second trip detector circuit. The POR circuit 104 further comprises the capacitor 227. The capacitor 227 comprises a first electrode coupled to the second terminal of the second diode circuit 210 at the reference node 226. The reference voltage VREF is generated at the reference node 226.

In some embodiments, the second trip detector circuit 212 may include the first and second low-detection transistors 228 and 230, each including the first and second current terminals and the control terminal. The first current terminal of the first low-detection transistor 228 may be configured to receive the reference voltage VREF, whereas the first current terminal of the second low-detection transistor 230 may be coupled to the low supply voltage terminal. The control terminals of the first and second low-detection transistors 228 and 230 may be configured to receive the supply voltage VDD. The second current terminal of the first low-detection transistor 228 may be coupled to the second current terminal of the second low-detection transistor 230 at the second output node 235. The first and second low-detection transistors 228 and 230 are configured to generate the second trigger signal TRG2 at the second output node 235. During the ramp-up and the steady state of the supply voltage VDD, the supply voltage VDD is greater than the reference voltage VREF, the first low-detection transistor 228 is deactivated and the second low-detection transistor 230 is activated, and the second trigger signal TRG2 is de-asserted. Further, during the ramp-down of the supply voltage VDD, the supply voltage VDD falls below the reference voltage VREF. When the supply voltage VDD is less than the reference voltage VREF by the second threshold value, the first low-detection transistor 228 is activated and the second low-detection transistor 230 is deactivated, and the second trigger signal TRG2 transitions from the de-asserted state to the asserted state. The control signal CS is logically equivalent to the second trigger signal TRG2.

In some embodiments, the second threshold value is a function of the supply voltage VDD, the threshold voltage of the first low-detection transistor 228, and the threshold voltage of the second low-detection transistor 230.

In some embodiments, the second trip detector circuit 212 may further include the fifth inverter 232 and the sixth inverter 234. The fifth inverter 232 may include an input terminal that is coupled to the second terminals of the first and second low-detection transistors 228 and 230, and configured to receive the second trigger signal TRG2, and an output terminal configured to generate the second intermediate signal IM2 that is the inverted version of the second trigger signal TRG2. The sixth inverter 234 may include an input terminal that is coupled to the output terminal of the fifth inverter 232, and configured to receive the second intermediate signal IM2, and an output terminal configured to generate the control signal CS that is the inverted version of the second intermediate signal IM2.

In some embodiments, during the ramp-up of the supply voltage VDD, the reset signal RST is de-asserted when the supply voltage VDD is less than the trip-high value, and when the supply voltage VDD exceeds the trip-high value, the reset signal RST transitions from the de-asserted state to the asserted state. During the steady state of the supply voltage VDD, the reset signal RST remains asserted. Further, during the ramp-down of the supply voltage VDD, the reset signal RST remains asserted when the supply voltage VDD is greater than the trip-low value, and when the supply voltage VDD falls below the trip-low value, the reset signal RST transitions from the asserted state to the de-asserted state. The reset signal RST is thus indicative of the state of the supply voltage VDD. The trip-high value corresponds to the value of the supply voltage VDD at which the trip node voltage VTN exceeds the first threshold value, and the trip-low value corresponds to the value of the supply voltage VDD at which the supply voltage VDD is less than the reference voltage VREF by the second threshold value.

In some embodiments, the trip-high value is greater than the trip-low value.

In some embodiments, the IC 100 may further include the functional circuit 106 that may be coupled to the POR circuit 104. The functional circuit 106 may be configured to receive the reset signal RST from the POR circuit 104 and execute the one or more operations associated therewith based on the asserted state of the reset signal RST.

In some embodiments, during the steady state of the supply voltage VDD, the current consumption of the POR circuit 104 is null.

While various embodiments of the present disclosure have been illustrated and described, it will be clear that the present disclosure is not limited to these embodiments only. Numerous modifications, changes, variations, substitutions, and equivalents will be apparent to those skilled in the art, without departing from the spirit and scope of the present disclosure, as described in the claims. Further, unless stated otherwise, terms such as "first" and "second" are used to arbitrarily distinguish between the elements such terms describe. Thus, these terms are not necessarily intended to indicate temporal or other prioritization of such elements.

I claim:

1. A circuit, comprising:
a power-on reset (POR) circuit configured to generate a reset signal indicative of a state of a supply voltage, the POR circuit comprising:
a first trip detector circuit comprising (i) an input terminal configured to receive a trip node voltage of a trip node, where the trip node voltage ramps up based on a ramp-up of the supply voltage, and (ii) an output terminal configured to generate the reset signal based on the trip node voltage such that, during the ramp-up of the supply voltage, the reset signal is de-asserted when the trip node voltage is less than a first threshold value and when the trip node voltage exceeds the first threshold value, the reset signal transitions from a de-asserted state to an asserted state;
a reference generating circuit comprising an input terminal configured to receive the supply voltage and an output terminal configured to generate a reference voltage, wherein the reference voltage is a reduced version of the supply voltage during the ramp-up and during a steady state of the supply voltage, and wherein during at least a portion of a ramp-down of the supply voltage, the supply voltage falls below the reference voltage;
a second trip detector circuit that is coupled to the output terminal of the reference generating circuit, and comprises an output terminal configured to generate a control signal based on the reference voltage and the supply voltage such that, during the ramp-down of the supply voltage, the control signal transitions from the de-asserted state to the asserted state when the supply voltage is less than the reference voltage by a second threshold value; and
a control circuit that is coupled to the trip node and the second trip detector circuit, and configured to alter the trip node voltage, based on the transition of the control signal, such that the reset signal transitions from the asserted state to the de-asserted state.

2. The circuit of claim 1, wherein the POR circuit further comprises a first diode circuit that comprises a first terminal configured to receive the supply voltage and a second terminal coupled to the trip node, and wherein the first diode circuit is configured to generate the trip node voltage at the second terminal such that the trip node voltage ramps up based on the ramp-up of the supply voltage and is a reduced version of the supply voltage, until the trip node voltage exceeds the first threshold value.

3. The circuit of claim 2, wherein during the ramp-up of the supply voltage, the trip node voltage is equal to a difference between the supply voltage and a threshold voltage associated with the first diode circuit, until the trip node voltage exceeds the first threshold value.

4. The circuit of claim 1, wherein during the ramp-up of the supply voltage, the trip node voltage is less than the supply voltage, until the trip node voltage exceeds the first threshold value, and wherein when the trip node voltage exceeds the first threshold value, the trip node voltage is adjusted to be equal to the supply voltage.

5. The circuit of claim 1,
wherein the POR circuit further comprises a first control transistor that comprises (i) a first current terminal configured to receive the supply voltage, (ii) a control terminal configured to receive an enable signal, and (iii) a second current terminal coupled to the trip node,
wherein the first control transistor is configured to control the trip node voltage such that when the first control transistor is activated, the trip node voltage is equal to the supply voltage,
wherein the first control transistor is activated when the enable signal is asserted, and
wherein the enable signal is de-asserted when the trip node voltage is less than the first threshold value and transitions from the de-asserted state to the asserted state when the trip node voltage exceeds the first threshold value.

6. The circuit of claim 1, wherein the control circuit comprises a second control transistor that comprises (i) a first current terminal coupled to a low supply voltage terminal, (ii) a control terminal that is coupled to the second trip detector circuit, and configured to receive the control signal, and (iii) a second current terminal coupled to the trip node, wherein the second control transistor is configured to control the trip node voltage such that when the second control transistor is activated, the trip node voltage is pulled down to a voltage of the low supply voltage terminal, and wherein the second control transistor is activated based on the assertion of the control signal.

7. The circuit of claim 1,
wherein the first trip detector circuit comprises a first inverter configured to generate a first trigger signal based on the trip node voltage,
wherein during the ramp-up of the supply voltage, the first trigger signal is de-asserted when the trip node voltage is less than the first threshold value, and when the trip node voltage exceeds the first threshold value, the first trigger signal transitions from the de-asserted state to the asserted state,
wherein based on the transition of the first trigger signal, the trip node voltage is adjusted to be equal to the supply voltage,
wherein the first trigger signal remains asserted and the trip node voltage remains equal to the supply voltage, during the steady state of the supply voltage, and
wherein during the ramp-down of the supply voltage, the first trigger signal transitions from the asserted state to the de-asserted state when the trip node voltage is pulled down to a voltage of a low supply voltage terminal.

8. The circuit of claim 7, wherein the first trip detector circuit further comprises:
a second inverter comprising (i) an input terminal that is coupled to an output terminal of the first inverter, and configured to receive the first trigger signal and (ii) an output terminal configured to generate a first intermediate signal that is an inverted version of the first trigger signal; and
a third inverter comprising (i) an input terminal that is coupled to the output terminal of the second inverter, and configured to receive the first intermediate signal and (ii) an output terminal configured to generate an enable signal that is an inverted version of the first intermediate signal, wherein the enable signal is logically equivalent to the first trigger signal, and wherein the trip node voltage is adjusted to be equal to the supply voltage based on a logic state of the enable signal.

9. The circuit of claim 7, wherein the first trip detector circuit further comprises a fourth inverter configured to generate the reset signal that is an inverted version of the first trigger signal.

10. The circuit of claim 7, wherein the first inverter generates the first trigger signal at an output terminal thereof, the first inverter comprises:
a first high-detection transistor that comprises (i) a first current terminal configured to receive the supply voltage, (ii) a control terminal configured to receive the trip node voltage, and (iii) a second current terminal; and
a second high-detection transistor that comprises (i) a first current terminal coupled to the low supply voltage terminal, (ii) a control terminal configured to receive the trip node voltage, and (iii) a second current terminal that is coupled to the second current terminal of the first high-detection transistor at a first output node, wherein the first output node corresponds to the output terminal of the first inverter, and wherein the first threshold value is a function of the supply voltage, a threshold voltage of the first high-detection transistor, and a threshold voltage of the second high-detection transistor.

11. The circuit of claim 1,
wherein the POR circuit further comprises a first control transistor that comprises a first current terminal configured to receive the supply voltage, and a second current terminal coupled to the trip node,
wherein the control circuit comprises a second control transistor that comprises a first current terminal coupled to a low supply voltage terminal, and a second current terminal coupled to the trip node,
wherein during the ramp-up of the supply voltage, when the trip node voltage is less than the first threshold value, the first control transistor and the second control transistor are deactivated, and when the trip node voltage exceeds the first threshold value, the first control transistor is activated and is configured to control the trip node voltage such that the trip node voltage is equal to the supply voltage,
wherein during the ramp-down of the supply voltage, when the supply voltage is less than the reference voltage by the second threshold value, the second control transistor is activated, and
wherein a drive strength of the second control transistor is greater than a drive strength of the first control transistor, and as a result, when the second control transistor is activated, the second control transistor is configured to control the trip node voltage such that the trip node voltage is pulled down to a voltage of the low supply voltage terminal.

12. The circuit of claim 1,
wherein the reference generating circuit corresponds to a second diode circuit that comprises (i) a first terminal configured to receive the supply voltage and (ii) a second terminal coupled to the second trip detector circuit,
wherein the POR circuit further comprises a capacitor comprising a first electrode coupled to the second terminal of the second diode circuit at a reference node, and wherein the reference voltage is generated at the reference node.

13. The circuit of claim 1, wherein the second trip detector circuit comprises:
a first low-detection transistor that comprises (i) a first current terminal that is coupled to the reference generating circuit, and configured to receive the reference voltage, (ii) a control terminal configured to receive the supply voltage, and (iii) a second current terminal; and
a second low-detection transistor that comprises (i) a first current terminal coupled to a low supply voltage terminal, (ii) a control terminal configured to receive the supply voltage, and (iii) a second current terminal that is coupled to the second current terminal of the second low-detection transistor at a second output node,
wherein the first low-detection transistor and the second low-detection transistor are configured to generate a second trigger signal at the second output node,
wherein during the ramp-up and the steady state of the supply voltage, (i) the supply voltage is greater than the reference voltage, (ii) the first low-detection transistor is deactivated and the second low-detection transistor is activated, and (iii) the second trigger signal is de-asserted,
wherein during the ramp-down of the supply voltage, the supply voltage falls below the reference voltage and when the supply voltage is less than the reference voltage by the second threshold value, the first low-detection transistor is activated and the second low-detection transistor is deactivated, and the second trigger signal transitions from the de-asserted state to the asserted state, and
wherein the control signal is logically equivalent to the second trigger signal.

14. The circuit of claim 13, wherein the second threshold value is a function of the supply voltage, a threshold voltage of the first low-detection transistor, and a threshold voltage of the second low-detection transistor.

15. The circuit of claim 13, wherein the second trip detector circuit further comprises:
a fifth inverter comprising (i) an input terminal that is coupled to the second current terminal of the first low-detection transistor and the second current terminal of the second low-detection transistor, and configured to receive the second trigger signal and (ii) an output terminal configured to generate a second intermediate signal that is an inverted version of the second trigger signal; and
a sixth inverter comprising (i) an input terminal that is coupled to the output terminal of the fifth inverter, and configured to receive the second intermediate signal and (ii) an output terminal configured to generate the control signal that is an inverted version of the second intermediate signal.

16. The circuit of claim 1,
wherein the reset signal is indicative of the state of the supply voltage such that
(i) during the ramp-up of the supply voltage, the reset signal is de-asserted when the supply voltage is less than a trip-high value, and when the supply voltage exceeds the trip-high value, the reset signal transitions from the de-asserted state to the asserted state,
(ii) during the steady state of the supply voltage, the reset signal remains asserted, and
(iii) during the ramp-down of the supply voltage, the reset signal remains asserted when the supply voltage is greater than a trip-low value, and when the supply voltage falls below the trip-low value, the reset signal transitions from the asserted state to the de-asserted state, and
wherein the trip-high value corresponds to a value of the supply voltage at which the trip node voltage exceeds the first threshold value, and the trip-low value corresponds to a value of the supply voltage at which the supply voltage is less than the reference voltage by the second threshold value.

17. The circuit of claim 16, wherein the trip-high value is greater than the trip-low value.

18. The circuit of claim 1, further comprising a functional circuit that is coupled to the POR circuit, and configured to receive the reset signal and execute one or more operations associated therewith based on the asserted state of the reset signal.

19. The circuit of claim 1, wherein during the steady state of the supply voltage, a current consumption of the POR circuit is null.

20. A circuit, comprising:
a power-on reset (POR) circuit configured to generate a reset signal indicative of a state of a supply voltage, the POR circuit comprising:
a first diode circuit that comprises (i) a first terminal configured to receive the supply voltage and (ii) a second terminal;
a first inverter that comprises (i) a supply terminal configured to receive the supply voltage, (ii) an input terminal coupled to the second terminal of the first diode circuit, and (iii) an output terminal configured to generate a first trigger signal;
a second diode circuit that comprises (i) a first terminal configured to receive the supply voltage and (ii) a second terminal;
a first low-detection transistor that comprises (i) a first current terminal coupled to the second terminal of the second diode circuit, (ii) a control terminal configured to receive the supply voltage, and (iii) a second current terminal;
a second low-detection transistor that comprises (i) a first current terminal coupled to a low supply voltage terminal, (ii) a control terminal configured to receive the supply voltage, and (iii) a second current terminal coupled to the second current terminal of the first low-detection transistor; and
a control transistor that comprises (i) a first current terminal coupled to the low supply voltage terminal, (ii) a second current terminal coupled to the second terminal of the first diode circuit and the input terminal of the first inverter, and (ii) a control terminal coupled to the second current terminal of the first low-detection transistor, wherein the reset signal is an inverted version of the first trigger signal.

* * * * *